US009748202B2

(12) United States Patent
Nabekura

(10) Patent No.: US 9,748,202 B2
(45) Date of Patent: Aug. 29, 2017

(54) SEMICONDUCTOR DEVICE

(71) Applicant: FUJITSU LIMITED, Kawasaki-shi, Kanagawa (JP)

(72) Inventor: Hideaki Nabekura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/189,533

(22) Filed: Jun. 22, 2016

(65) Prior Publication Data

US 2017/0018528 A1    Jan. 19, 2017

(30) Foreign Application Priority Data

Jul. 15, 2015  (JP) .................................. 2015-141387

(51) Int. Cl.
| | | |
|---|---|---|
| H01L 23/02 | (2006.01) | |
| H01L 21/00 | (2006.01) | |
| H01L 25/065 | (2006.01) | |
| H01L 23/498 | (2006.01) | |
| H01L 25/18 | (2006.01) | |
| H01L 25/11 | (2006.01) | |

(52) U.S. Cl.
CPC .... *H01L 25/0652* (2013.01); *H01L 23/49838* (2013.01); *H01L 25/117* (2013.01); *H01L 25/18* (2013.01); H01L 2224/16227 (2013.01); H01L 2224/17181 (2013.01); H01L 2225/06517 (2013.01); H01L 2225/06572 (2013.01); H01L 2924/15192 (2013.01)

(58) Field of Classification Search
CPC .......................... H01L 23/49822; H01L 25/117

USPC .......................................... 257/686; 438/109
See application file for complete search history.

(56) References Cited

U.S. PATENT DOCUMENTS

| | | | |
|---|---|---|---|
| 7,746,656 B2* | 6/2010 | Shim | H01L 23/3128 174/260 |
| 8,163,600 B2* | 4/2012 | Chow | H01L 23/3128 257/686 |
| 9,041,176 B2* | 5/2015 | Li | H01L 25/065 257/685 |
| 2006/0170112 A1 | 8/2006 | Tanaka et al. | |
| 2007/0096286 A1 | 5/2007 | Hino | |
| 2008/0237846 A1 | 10/2008 | Terui et al. | |

FOREIGN PATENT DOCUMENTS

| | | |
|---|---|---|
| JP | 2002-343930 | 11/2002 |
| JP | 2006-210745 | 8/2006 |
| JP | 2007-123457 | 5/2007 |
| JP | 2008-244104 | 10/2008 |

* cited by examiner

*Primary Examiner* — Calvin Lee
(74) *Attorney, Agent, or Firm* — Fujitsu Patent Center

(57) ABSTRACT

A semiconductor device includes a first circuit board having a first chip and a second chip mounted on a first base, the second chip having a greater height from the first base than that of the first chip; and a second circuit board having a third chip and a fourth chip mounted on a second base, the fourth chip having a greater height from the second base than that of the third chip, the second circuit board being disposed overlapping with the first base such that the second base faces the first chip, and the second base not contacting the second chip.

10 Claims, 13 Drawing Sheets

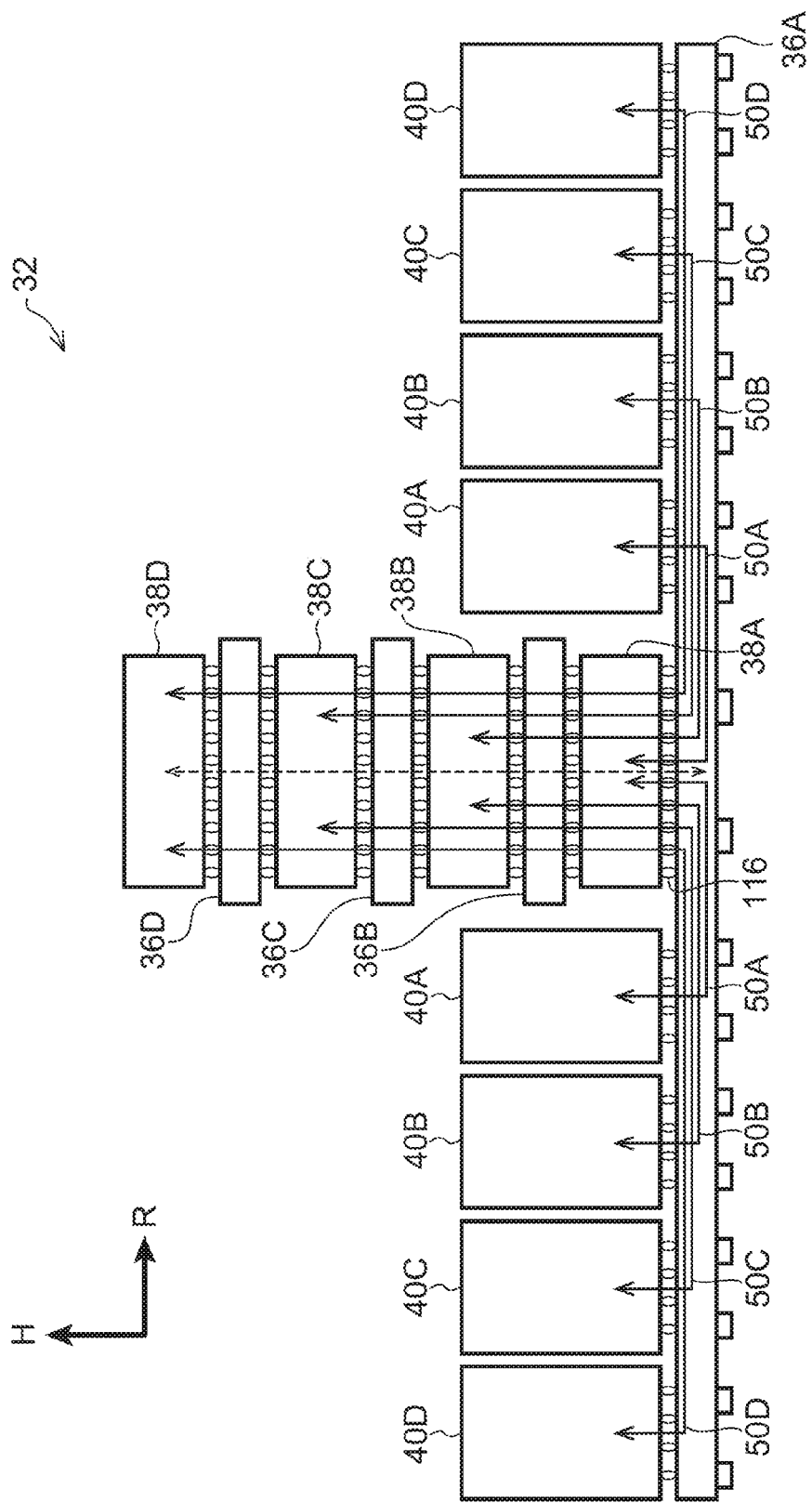

SEMICONDUCTOR DEVICE

CROSS-REFERENCE TO RELATED APPLICATION

This application is based upon and claims the benefit of priority of the prior Japanese Patent Application No. 2015-141387, filed on Jul. 15, 2015, the entire contents of which are incorporated herein by reference.

FIELD

The embodiments discussed herein are related to a semiconductor device.

BACKGROUND

A structure exists in which an interposer chip for connecting dissimilar upper and lower semiconductor chips is disposed between the upper and lower chips, and respective ground pins and power source pins of the semiconductor chips are connected by a thick wiring pattern.

A structure also exists in which semiconductor elements are flip chip bonded together through bumps, and an interposer provided with a wiring layer of a flat solid layer formed by an electrically conductive material is connected to the bumps.

A structure also exists in which a first semiconductor device is mounted on one face of a first wiring circuit board, a second semiconductor device is mounted on another face of the first wiring circuit board, and a second wiring circuit board that includes an opening containing a second semiconductor device and that includes an external electrode is connected to the other face of the first wiring circuit board.

A structure also exists in which plural semiconductor chips are mounted on a single package, and the structure includes a relay wiring circuit board that performs wiring between an application specified integrated circuit (ASIC) and a memory chip.

RELATED PATENT DOCUMENTS

Japanese Laid-Open Patent Publication No. 2006-210745
Japanese Laid-Open Patent Publication No. 2002-343930
Japanese Laid-Open Patent Publication No. 2007-123457
Japanese Laid-Open Patent Publication No. 2008-244104

SUMMARY

According to an aspect of the embodiments, a semiconductor device includes a first circuit board having a first chip and a second chip mounted on a first base, with the second chip having a greater height from the first base than that of the first chip; and a second circuit board having a third chip and a fourth chip are mounted on a second base, with the fourth chip having a greater height from the second base than that of the third chip, the second circuit board disposed overlapping with the first base such that the second base faces the first chip, and the second base not contacting the second chip.

The object and advantages of the invention will be achieved and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 is a face-on view illustrating a semiconductor device of a first comparative example.

DESCRIPTION OF EMBODIMENTS

Detailed explanation follows regarding a first exemplary embodiment, with reference to the drawings.

Figure 1:
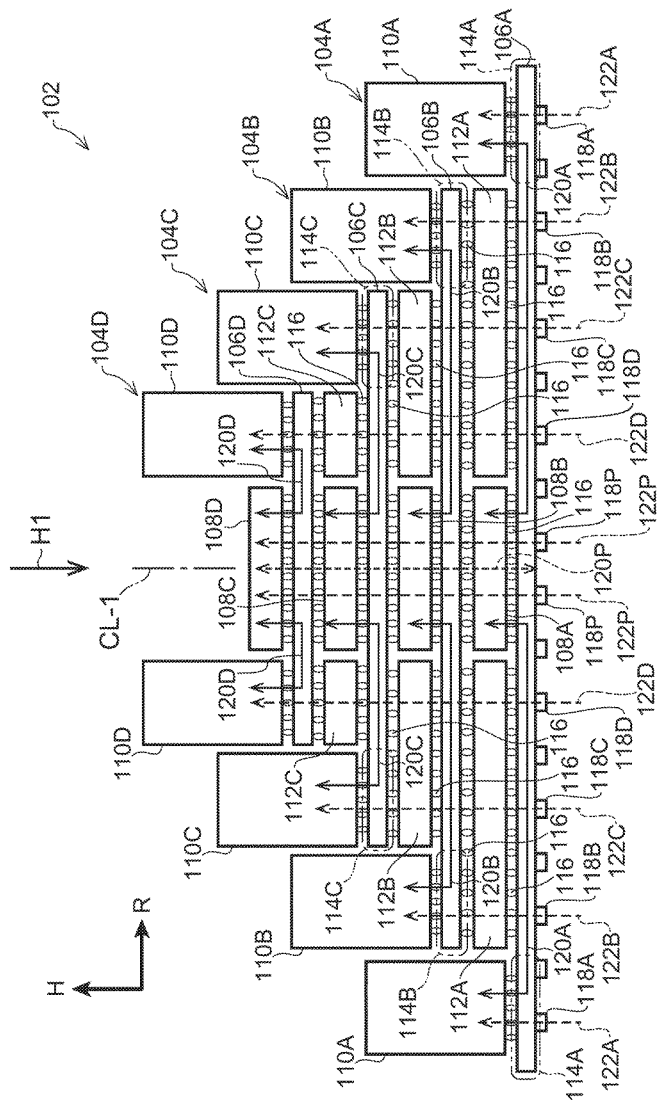
FIG. 1 is a face-on view illustrating a semiconductor device of a first exemplary embodiment.
Figure 2:
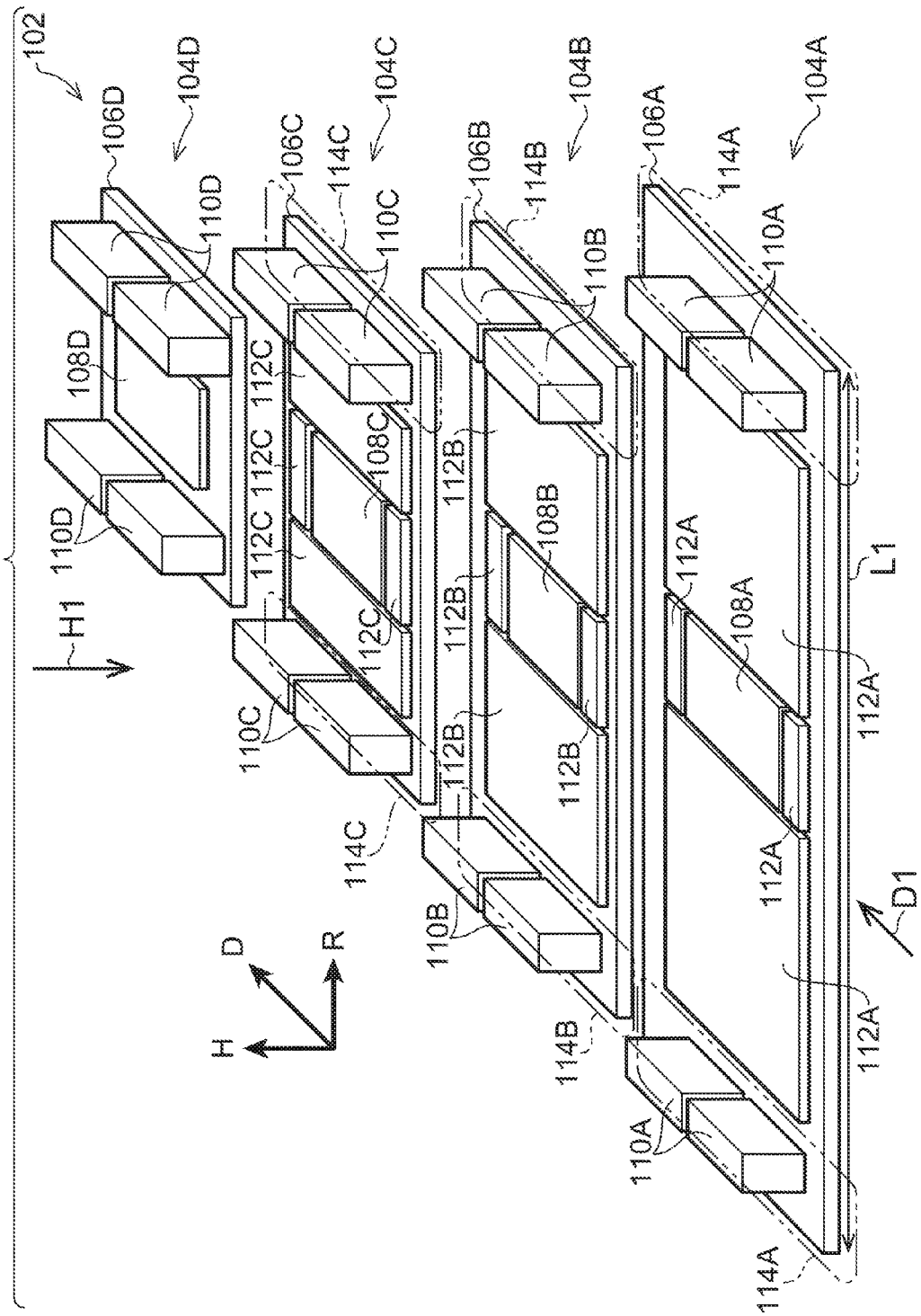
FIG. 2 is an exploded perspective view illustrating a semiconductor device of the first exemplary embodiment.
Figure 3:
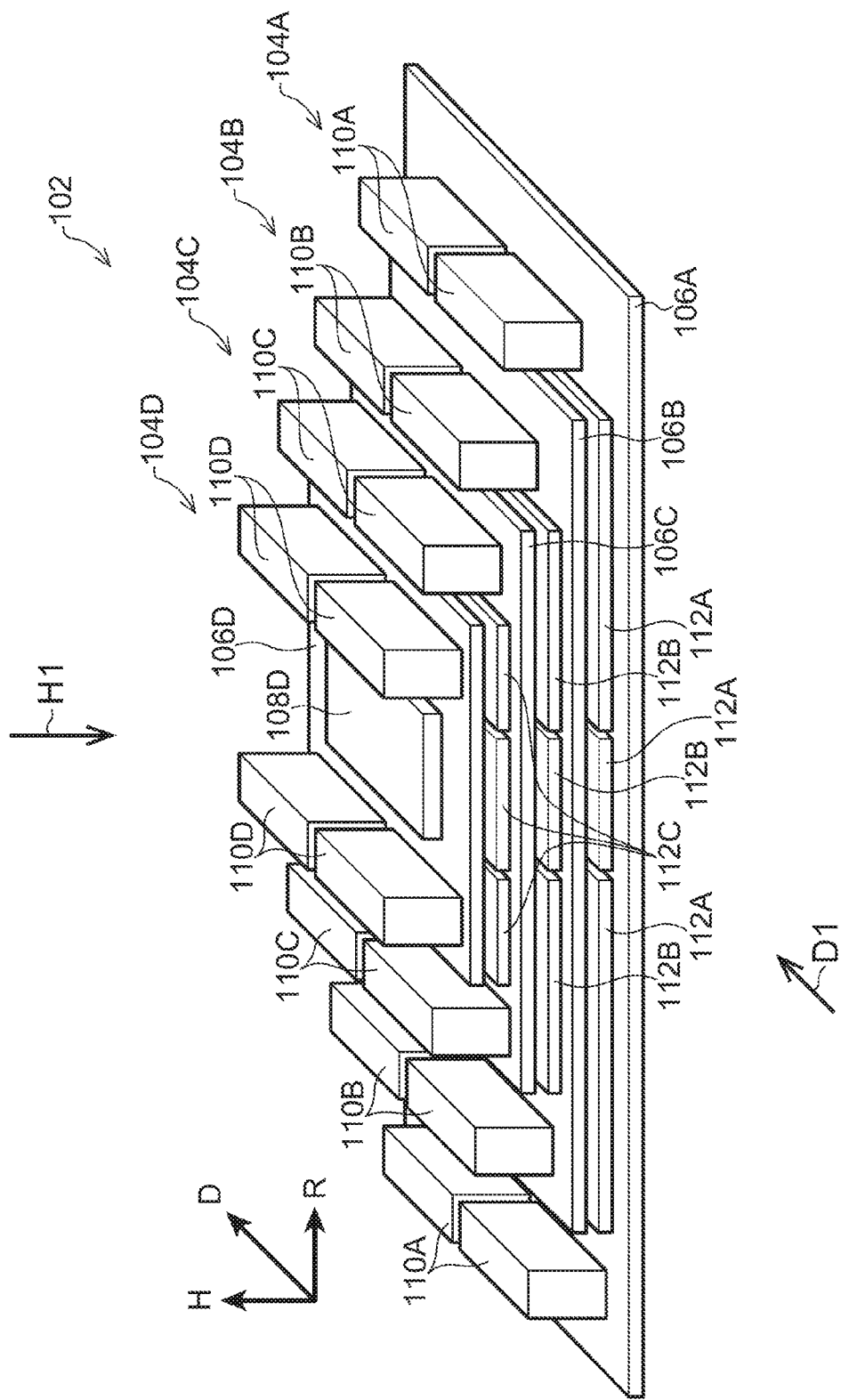
FIG. 3 is a perspective view illustrating a semiconductor device of the first exemplary embodiment.

As illustrated in FIG. 1 to FIG. 3, a semiconductor device 102 of the first exemplary embodiment includes plural (four in the example of FIG. 1 to FIG. 3) circuit boards 104A, 104B, 104C, 104D. The circuit boards 104A, 104B, 104C, 104D are disposed overlapping with each other in this sequence from the bottom up. In the drawings, the arrows H, D, R respectively indicate an upward direction, an inward direction, and a rightward direction of the semiconductor device 102 as viewed face-on along an arrow D1 direction. These directions are for convenience of explanation. Each of the drawings illustrate a state in which the circuit boards 104A, 104B, 104C, 104D are stacked in this sequence from a lower side up; however, the orientation of the semiconductor device 102 in usage conditions is not limited to the direction illustrated in each of the drawings.

The circuit boards 104A, 104B, 104C, 104D respectively include bases 106A, 106B, 106C, 106D. The circuit boards 104A, 104B, 104C, 104D further include, mounted on the bases 106A, 106B, 106C, 106D, processor chips 108A, 108B, 108C, 108D and memory chips 110A, 110B, 110C, 110D. The circuit boards 104A, 104B, 104C further include interposers 112A, 112B, 112C mounted on the bases 106A, 106B, 106C. The semiconductor device 102 of the present exemplary embodiment is, for example, a semiconductor device that has different semiconductor chips mounted on a base to form a circuit board, and that has a system in package (SiP) structure in which such circuit boards are plurally stacked and collected in a single package. Examples of a processor chip include an ASIC.

The bases 106A, 106B, 106C, 106D are each formed in a plate shape by a material that is insulating and rigid, such as glass epoxy, phenolic paper, or a ceramic. As illustrated in FIG. 2, the bases 106A, 106B, 106C, 106D are rectangles in plan view (viewed along an arrow H1 direction) in the first exemplary embodiment. The bases 106A, 106B, 106C, 106D may each be the same material, or may be different materials.

The lengths of the bases 106A, 106B, 106C, 106D along their length directions defines widths L1. In the first exemplary embodiment, the widths L1 respectively narrow on progression from the base 106A at the lower side toward the bases 106B, 106C, 106D at the upper side.

The bases 106A, 106B, 106C, 106D overlap with each other such that their left-right direction (the arrow R direction and an opposite direction) centers (indicated by the central line CL-1 in FIG. 1) are aligned in plan view. Accordingly, out of two vertically adjacent bases, the base at the lower side has protrusions that protrude further toward the outside than the base at the upper side in plan view. For example, the base 106A has a pair of protrusions 114A that protrude further toward the left-right direction outsides than the base 106B. The base 106B has a pair of protrusions 114B that protrude further toward the left-right direction outside directions than the base 106C. The base 106C has a pair of protrusions 114C that protrude further toward the left-right direction outside directions than the base 106D.

The processor chip 108A is disposed at the length direction center of the base 106A, which is in the lowermost position, and one, or plural, of the memory chips 110A are disposed in the vicinity of both length direction ends (the protrusions 114A) of the base 106A. Plural of the interposers 112A are disposed on the base 106A surrounding the processor chip 108A in plan view. The height of the memory chips 110A from the base 106A is greater than that of the processor chip 108A.

The processor chip 108A and the memory chips 110A are connected together by signal lines 120A of the base 106A. For example, in various processing by the processor chip 108A, commands or reading/writing of data is performed on the memory chips 110A mounted on the base 106A.

The heights of the processor chip 108A and the interposers 112A from the base 106A are the same.

As illustrated in FIG. 1, bumps 116 are provided to a lower face and an upper face of the processor chip 108A. The bumps 116 are also provided to a lower face and an upper face of the interposers 112A. The processor chip 108A and the interposers 112A are each electrically connected to the base 106A at the lower side and the base 106B at the upper side through the bumps 116. The bumps 116 are also provided to a lower face of the memory chips 110A. The memory chips 110A are electrically connected to the base 106A through the bumps 116.

Plural power supply terminals 118A, 118B, 118C, 118D are provided to the base 106A on an opposite face (the lower face in FIG. 1) to a mounting face of the processor chip 108A and the memory chips 110A. Power is supplied to the power supply terminals 118A, 118B, 118C, 118D from a power source unit, not illustrated in the drawings.

Power supply routes 122A for supplying power from the power supply terminals 118A to the memory chips 110A are formed on the base 106A.

The power supply terminals 118A overlap with the memory chips 110A in plan view. Portions of the base 106A are positioned at the locations of these overlaps, and the power supply routes 122A are formed in a straight line shape through the base 106A.

The base 106B, which is positioned second from bottom and is disposed at the upper side of the base 106A, is narrower in width than the base 106A, and has a shape that does not contact the memory chips 110A even when the base 106B is disposed directly on the processor chip 108A and the interposers 112A. In other words, protrusions 114A that protrude further toward the outside than the base 106B are formed on the base 106A, and mounting the memory chips 110A on the protrusions 114A achieves a structure in which the base 106B is not in contact with the memory chips 110A.

The processor chip 108B is disposed at the length direction center of the base 106B, and one, or plural, of the memory chips 110B are disposed in the vicinity of both length direction ends (the protrusions 114B) of the base 106B. Plural of the interposers 112B are disposed on the base 106B surrounding the processor chip 108B in plan view. The height of the memory chips 110B from the base 106B is greater than that of the processor chip 108B.

The processor chip 108B and the memory chips 110B are connected together by signal lines 120B of the base 106B. For example, in various processing by the processor chip 108B, temporary storage of data is handled by the memory chips 110B mounted on the base 106B.

The heights of the processor chip 108B and the interposers 112B from the base 106B are the same.

As illustrated in FIG. 1, bumps 116 are provided to a lower face and an upper face of the processor chip 108B. The bumps 116 are also provided to a lower face and an upper face of the interposers 112B. The processor chip 108B and the interposers 112B are each electrically connected to the base 106B at the lower side and the base 106C at the upper side through the bumps 116. The bumps 116 are also provided to a lower face of the memory chips 110B. The memory chips 110B are electrically connected to the base 106B through the bumps 116.

Power supply routes 122B for supplying power from the power supply terminals 118B to the memory chips 110B are formed on the base 106A, the interposers 112A, and the base 106B. The positions of the memory chips 110B in the left-right direction are different from those of the memory chips 110A, such that the power supply routes 122B do not overlap with the power supply routes 122A.

The power supply terminals 118B overlap with the memory chips 110B in plan view. Portions of the base 106A, the interposers 112A, and the base 106B are positioned at the locations of these overlaps, and the power supply routes 122B are formed in a straight line shape through the base 106A, the interposers 112A, and the base 106B.

The base 106C, which is positioned third from bottom and is disposed at the upper side of the base 106B, is narrower in width than the base 106B, and has a shape that does not contact the memory chips 110B even when the base 106C is disposed directly on the processor chip 108B and the interposers 112B. In other words, protrusions 114B that protrude further toward the outside than the base 106C are formed on the base 106B, and mounting the memory chips 110B on the protrusions 114B achieves a structure in which the base 106C is not in contact with the memory chips 110B.

The processor chip 108C is disposed at the length direction center of the base 106C, and one, or plural, of the memory chips 110C are disposed in the vicinity of both length direction ends (the protrusions 114C) of the base 106C. Plural of the interposers 112C are disposed on the base 106C surrounding the processor chip 108C in plan view. The height of the memory chips 110C from the base 106C is greater than that of the processor chip 108C.

The processor chip 108C and the memory chips 110C are connected together by signal lines 120C of the base 106C. For example, in various processing by the processor chip 108C, temporary storage of data is handled by the memory chips 110C mounted on the base 106C.

The heights of the processor chip 108C and the interposers 112C from the base 106C are the same.

As illustrated in FIG. 1, bumps 116 are provided to a lower face and an upper face of the processor chip 108C. The bumps 116 are also provided to a lower face and an upper face of the interposers 112C. The processor chip 108C and the interposers 112C are each electrically connected to the base 106C at the lower side and the base 106D at the upper side through the bumps 116. The bumps 116 are also provided to a lower face of the memory chips 110C. The memory chips 110C are electrically connected to the base 106C through the bumps 116.

Power supply routes 122C for supplying power from the power supply terminals 118C to the memory chips 110C are formed on the base 106A, the interposers 112A, the base 106B, the interposers 112B, and the base 106C. The positions of the memory chips 110C in the left-right direction are different from those of the memory chips 110A, 110B such that the power supply routes 122C do not overlap with the power supply routes 122A, 122B.

The power supply terminals 118C overlap with the memory chips 110C in plan view. Portions of the base 106A, the interposers 112A, the base 106B, the interposers 112B, and the base 106C are positioned at the locations of these overlaps. The power supply routes 122C are formed in a straight line shape through the base 106A, the interposers 112A, the base 106B, the interposers 112B, and the base 106C.

The base 106D, which is in the uppermost position and is disposed at the upper side of the base 106C, is narrower in width than the base 106C, and has a shape that does not contact the memory chips 110C even when the base 106D is disposed directly on the processor chip 108C and the interposers 112C. In other words, protrusions 114C that protrude further toward the outside than the base 106D are formed on the base 106C, and mounting the memory chips 110C on the protrusions 114C achieves a structure in which the base 106D is not in contact with the memory chips 110C.

The processor chip 108D is disposed at the length direction center of the base 106D, and one, or plural, of the memory chips 110D are disposed in the vicinity of both length direction ends of the base 106D. The memory chips 110D are disposed on the base 106D surrounding the processor chip 108D, and are disposed in close proximity to the processor chip 108D at both left-right direction sides in particular. The height of the memory chips 110D from the base 106D is greater than that of the processor chip 108D.

The processor chip 108D and the memory chips 110D are connected together by signal lines 120D of the base 106D. For example, in various processing by the processor chip 108D, temporary storage of data is handled by the memory chips 110D mounted on the base 106D.

As illustrated in FIG. 1, bumps 116 are provided to a lower face of the processor chip 108D. The processor chip 108D is electrically connected to the base 106D through the bumps 116. The bumps 116 are also provided to a lower face of the memory chips 110D. The memory chips 110D are electrically connected to the base 106D through the bumps 116.

Power supply routes 122D for supplying power from the power supply terminals 118D to the memory chips 110D are formed on the base 106A, the interposers 112A, the base 106B, the interposers 112B, the base 106C, the interposers 112C, and the base 106D. The positions of the memory chips 110D in the left-right direction are different from those of the memory chips 110A, 110B, 110C such that the power supply routes 122D do not overlap with the power supply routes 122A, 122B, 122C.

The power supply terminals 118D overlap with the memory chips 110D in plan view. Portions of the base 106A, the interposers 112A, the base 106B, the interposers 112B, the base 106C, the interposers 112C, and the base 106D are positioned at the locations of these overlaps. The power supply routes 122D are formed in a straight line shape through the base 106A, the interposers 112A, the base 106B, the interposers 112B, the base 106C, the interposers 112C, and the base 106D.

A signal route 120P and a power supply routes 122P are formed in the base 106A, the processor chip 108A, the base 106B, the processor chip 108B, the base 106C, the processor chip 108C, the base 106D, and the processor chip 108D. Signals are transmitted and received between the processor chips via the signal route 120P. The power supply routes 122P supply power from power supply terminals 118P to each of the processor chips. The base 106A, the processor chip 108A, the base 106B, the processor chip 108B, the base 106C, the processor chip 108C, the base 106D, and the processor chip 108D overlap in plan view. The signal route 120P and the power supply routes 122P are formed in a straight line shape through the location of this overlap.

Next, explanation follows regarding operation of the present exemplary embodiment.

As illustrated in FIG. 1, in the semiconductor device 102 of the first exemplary embodiment, a base positioned at the upper side of each processor chip is narrower in width than a base positioned at the lower side of the processor chip. When viewed face-on (in the arrow D1 direction), the semiconductor device 102 has a structure in which both left and right sides change height in a stepped pattern. Namely, a base positioned at the upper side of a processor chip has a shape that does not contact the memory chips mounted on a base at the lower side of the processor chip. Accordingly, in a structure in which plural circuit boards overlap with each other, processor chips on bases and bases at the upper side of those bases can be stacked in close proximity without restricting the height of the memory chips. The distance between processor chips is smaller than in cases in which gaps arise between the processor chips and the bases. Moreover, there is no need for a material to fill these gaps in order to electrically connect the processor chips together.

A semiconductor device 32 of a first comparative example is illustrated in FIG. 13. In the semiconductor device 32 of the first comparative example, a processor chip 38A is mounted on the center of a base 36A furthest toward the lower side. Moreover, the memory chips 40A, 40B, 40C, 40D, which have greater heights than the processor chip 38A, are mounted in this sequence from the left-right direction center toward the outside at both sides of the processor chip 38A on the base 36A furthest toward the lower side.

A processor chip 38B is mounted on a base 36B disposed at the upper side of the processor chip 38A. Similarly, a processor chip 38C is mounted on a base 36C disposed at the upper side of the processor chip 38B, and a processor chip 38D is mounted on a base 36D disposed at the upper side of the processor chip 38C.

The memory chips 40A correspond to the processor chip 38A, and transmit and receive electrical signals using signal lines 50A of the base 36A.

The memory chips 40B correspond to the processor chip 38B, and transmit and receive electrical signals using signal lines 50B of the base 36A, the processor chip 38A, and the base 36B.

The memory chips 40C correspond to the processor chip 38C, and transmit and receive electrical signals using signal lines 50C of the base 36A, the processor chip 38A, the base 36B, the processor chip 38B, and the base 36C.

The memory chips 40D correspond to the processor chip 38D, and transmit and receive electrical signals using signal lines 50D of the base 36A, the processor chip 38A, the base 36B, the processor chip 38B, the base 36C, the processor chip 38C, and the base 36D.

The bases 36B, 36C, 36D are each formed with a narrow width so as not to contact the memory chips 40A at the innermost sides.

In the semiconductor device 32 of the first comparative example, the memory chips 40A, 40B, 40C, 40D are all mounted on the base 36A, which is furthest toward the lower side. Consequently, the processor chip 38B and the memory chips 40B are not on the same base. Transmission and reception of electrical signals between the processor chip 38B and the memory chips 40B occurs via the signal lines 50B, namely via the base 36A, the processor chip 38A, and the base 36B. The line length is therefore longer than in a structure in which the processor chip 38B and the memory chips 40B are mounted on the same base. In a case in which the line length between the processor chip 38B and the memory chips 40B is long, memory latency increases, and the throughput of the processor chip 38B may decrease.

In the semiconductor device 32 of the first comparative example, line lengths (lengths of the signal lines 50C, 50D) are even longer between the processor chips 38C, 38D in the layers above and the respective corresponding memory chips 40C, 40D. Accordingly, this may lead to increases in memory latency and a reduction in the throughput of the processor chips 38C, 38D.

In contrast, in the semiconductor device 102 of the first exemplary embodiment, a processor chip and its corresponding memory chips are mounted on a single base for each of the circuit boards 104A, 104B, 104C, 104D. Shorter line lengths between processor chips and their corresponding memory chips than in the structure of the comparative example are therefore achievable. This enables memory latency to be reduced, and increases the throughput of the processor chips. A reduction in power consumption is also enabled since the line lengths between processor chips and their corresponding memory chips are shortened.

In the semiconductor device 102 of the first exemplary embodiment, the interposers 112A are disposed between the bases 106A, 106B, the interposers 112B are disposed between the bases 106B, 106C, and the interposers 112C are disposed between the bases 106C, 106D. The interposers 112A, 112B, 112C are examples of connecting members. Namely, a simple structure employing the interposers 112A, 112B, 112C enables the power supply routes 122A to 122D, which supply power from the power supply terminals 118A to 118D to the memory chips 110A to 110D, to be formed.

Thus, in the semiconductor device 102 of the first exemplary embodiment, the interposers are disposed between facing bases, and electrically connect the bases. Thus, each of the power supply routes 122A to 122D can be formed in a straight line shape between the corresponding power supply terminals 118A to 118D and memory chips 110A to 110D. The routes are shorter than in a structure in which the power supply routes 122A, 122B, 122C, 122D bend (have a curve or corner), enabling more efficient power supply to the memory chips 110A, 110B, 110C, 110D.

The respective interposers are mounted at positions so as to surround the processor chips (an example of a first chip) in plan view of the bases. Namely, the space surrounding the processor chips can be effectively utilized to dispose the interposers.

Each of the interposers is mounted on a corresponding first base. For example, the interposers 112A are mounted on the base 106A. A structure can thereby be easily achieved in which the interposers 112A (the connecting member) are disposed surrounding the processor chip 108A (the first chip) on the base 106A (the first base).

The height of the connecting member from the first base is equivalent to the height of the first chip. This enables a second base to be stably disposed at the upper side of the connecting member and the first chip, since the upper face of the connecting member and the upper face of the first chip are positioned in the same plane. For example, the connecting member does not become a hindrance when the second base is disposed on the first chip.

The first chip is electrically connected to the first base and the second base through the bumps 116. The first chip, for example, operates as a signal route and a power supply route in the structure illustrated in FIG. 1, and electrical contact with the first base and the second base can be securely maintained by the bumps 116.

The connecting member is electrically connected to the first base and the second base through the bumps 116. The connecting member, for example, operates as a power supply route in the structure illustrated in FIG. 1, and electrical contact with the first base and the second base can be securely maintained by the bumps 116.

The power supply routes 122A, 122B, 122C, 122D are at mutually different positions in the left-right direction. Since current flow to the memory chips 110A, 110B, 110C, 110D is distributed without being concentrated at a particular location (current density is low), deterioration of the wiring due to electromigration (loss of the material forming the wiring) can be suppressed, and the durability of the semiconductor device 102 is high.

Although a structure in which the four circuit boards 104A, 104B, 104C, 104D are disposed overlapping with each other has been given as an example of the semiconductor device 102 of the first exemplary embodiment above, for example, a structure in which two circuit boards are disposed overlapping with each other, or a structure in which three circuit boards are disposed overlapping with each other, may be employed. Moreover, a structure in which five or more circuit boards are disposed overlapping with each other may be employed. In cases in which a structure in which the two circuit boards 104A, 104B initially serve as the semiconductor device 102, and additional functionality is subsequently added, a structure in which the circuit board 104C, and also the circuit board 104D, overlap with the two circuit boards 104A, 104B may be employed.

The relationship between the circuit board 104A and the circuit board 104B is that the circuit board 104A is the first circuit board and the circuit board 104B is the second circuit board. In this case, the base 106A is an example of the first base, the processor chip 108A is an example of the first chip, and the memory chip 110A is an example of the second chip. The base 106B is an example of a second base, the processor chip 108B is an example of a third chip, and the memory chip 110B is an example of a fourth chip.

In contrast, the relationship between the circuit board 104B and the circuit board 104C is that the circuit board 104B is the first circuit board, and the circuit board 104C is the second circuit board. In this case, the base 106B is an example of a first base, the processor chip 108B is an example of a first chip, and the memory chip 110B is an example of a second chip. Moreover, the base 106C is an example of a second base, the processor chip 108C is an example of a third chip, and the memory chip 110C is an example of a fourth chip.

The relationship between the circuit board 104C and the circuit board 104D is that the circuit board 104C is the first circuit board and the circuit board 104D is the second circuit board. In this case, the base 106C is an example of the first base, the processor chip 108C is an example of the first chip, and the memory chip 110C is an example of the second chip. Moreover, the base 106D is an example of the second circuit board, the processor chip 108D is an example of the third chip, and the memory chip 110D is an example of the fourth chip.

In the semiconductor device 102 of the first exemplary embodiment, the second base is formed narrower in width than the first base, and a structure in which the second base is not in contact with the second chip on the first base is thereby achieved. Since it is sufficient to make the second base narrower in width than the first base, this does not lead to increased complexity in the structure of the second base.

In the semiconductor device 102 of the first exemplary embodiment, each of the first bases has a structure that includes a protrusion protruding further to the outside than the corresponding second circuit board. Mounting the second chip to the protrusion enables a structure to be easily achieved in which the second base is not in contact with the second chip on the first base.

Next, explanation follows regarding a second exemplary embodiment. Elements, members, and the like in the second exemplary embodiment that are similar to those of the first exemplary embodiment are allocated the same reference numerals, and detailed explanation thereof is omitted.

Figure 4:
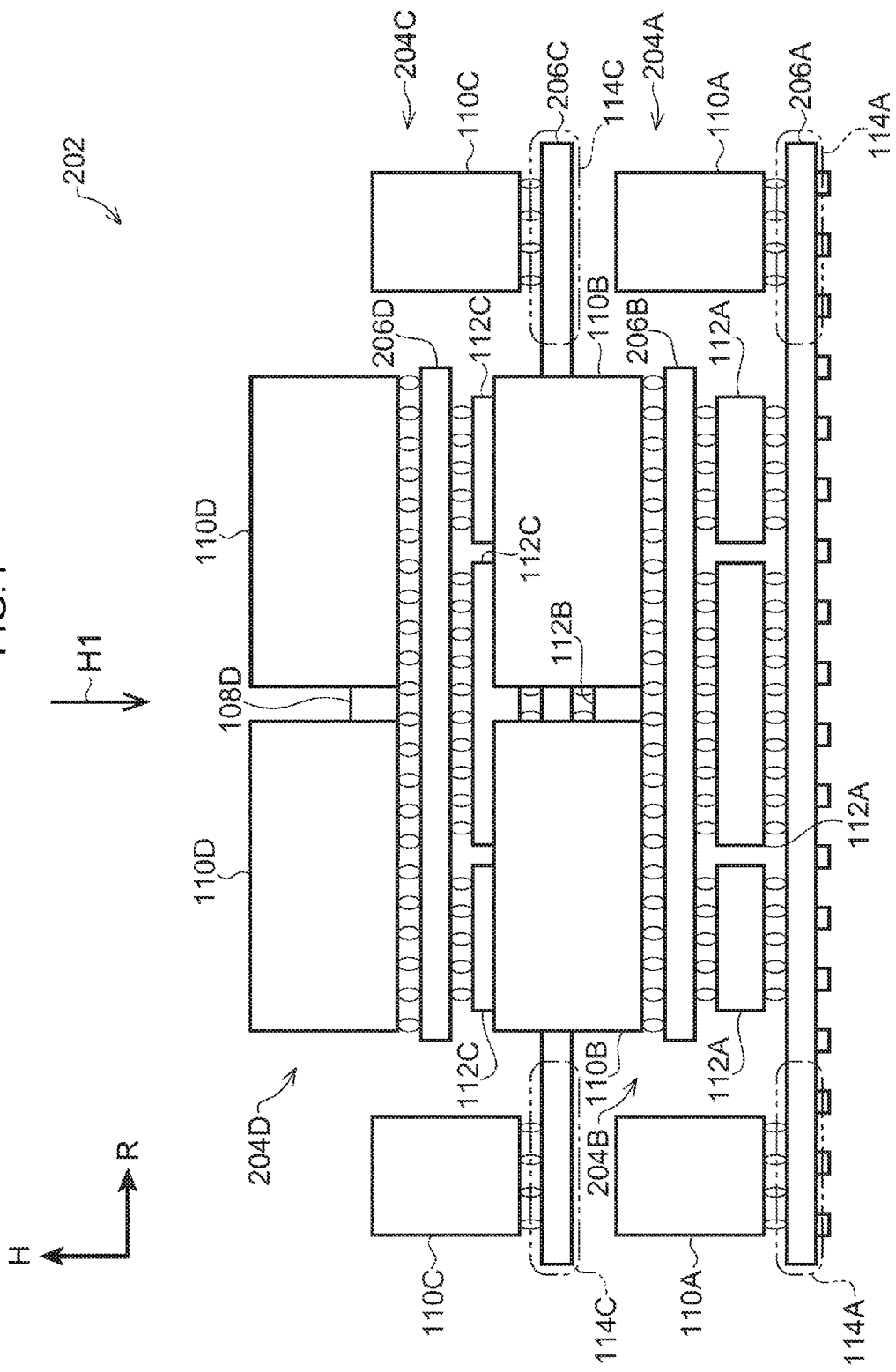
FIG. 4 is a face-on view illustrating a semiconductor device of a second exemplary embodiment.
Figure 5:
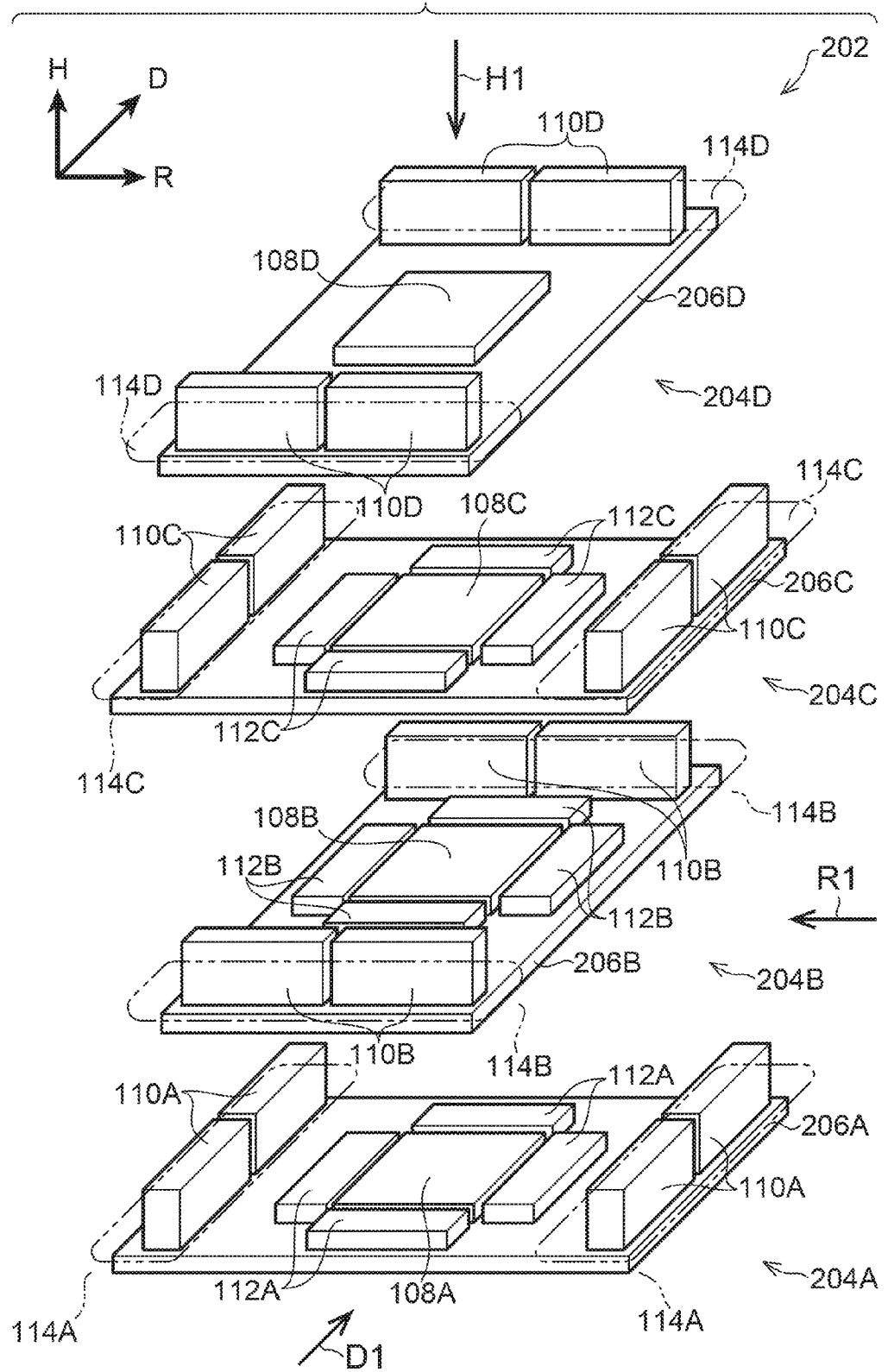
FIG. 5 is an exploded perspective view illustrating a semiconductor device of the second exemplary embodiment.
Figure 6:
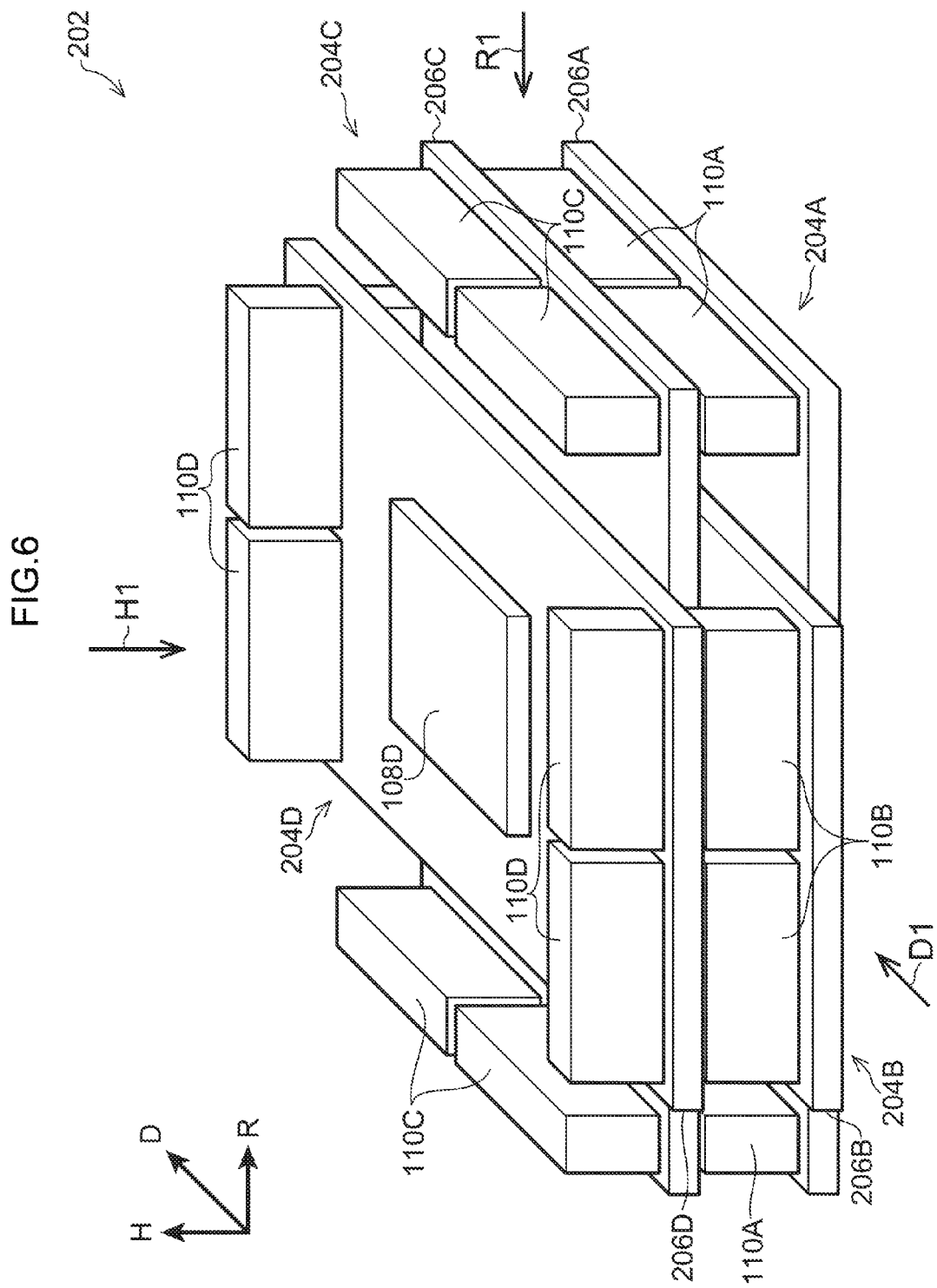
FIG. 6 is a perspective view illustrating a semiconductor device of the second exemplary embodiment.

As illustrated in FIG. 4 to FIG. 6, a semiconductor device 202 of a second exemplary embodiment includes plural (four in the example of FIG. 4 to FIG. 6) circuit boards 204A, 204B, 204C, 204D disposed overlapping with each other in this sequence. The circuit boards 204A, 204B, 204C, 204D each include a base 206A, 206B, 206C, 206D formed as a rectangular plate.

The processor chip 108A is disposed at the length direction center of the base 206A, and one, or plural, of the memory chips 110A are disposed in the vicinity of both length direction ends (protrusions 114A) of the base 206A. Plural interposers 112A are disposed on the base 206A surrounding the processor chip 108A in plan view.

The processor chip 108B is disposed at the length direction center of the base 206B, and one, or plural, of the memory chips 110B are disposed in the vicinity of both length direction ends (protrusions 114B) of the base 206B. Plural interposers 112B are disposed on the base 206B surrounding the processor chip 108B in plan view.

The processor chip 108C is disposed at the length direction center of the base 206C, and one, or plural, of the memory chip 110C are disposed in the vicinity of both length direction ends (protrusions 114C) of the base 206C. Plural interposers 112C are disposed on the base 206C surrounding the processor chip 108C in plan view.

The processor chip 108D is disposed at the length direction center of the base 206D, and one, or plural, of the memory chips 110D are disposed in the vicinity of both length direction ends (protrusions 114D) of the base 206D.

In the semiconductor device 202 of the second exemplary embodiment, the bases 206A, 206B are disposed such that the length direction of the base 206B is orthogonal to the length direction of the base 206A in plan view (as viewed in the arrow H1 direction). The protrusions 114A are thereby formed on the base 206A protruding further toward the outside than the base 206B in plan view. The memory chips 110A are mounted on the protrusions 114A.

In the semiconductor device 202 of the second exemplary embodiment, the bases 206B, 206C are disposed such that the length direction of the base 206C is orthogonal to the length direction of the base 206B. The protrusions 114B are thereby formed on the base 206B protruding further toward the outside than the base 206C in plan view. The memory chips 110B are mounted on the protrusions 114B.

In the semiconductor device 202 of the second exemplary embodiment, the bases 206C, 206D are disposed such that the length direction of the base 206D is orthogonal to the length direction of the base 206C. The protrusions 114C are thereby formed on the base 206C protruding further toward the outside than the base 206D in plan view. The memory chips 110C are mounted on the protrusions 114C.

In the semiconductor device 202 of the second exemplary embodiment, the sum of the heights of the interposers 112A, the base 206B, and the interposers 112B are is such that a gap wider than the height of the memory chip 110A is produced between the protrusions 114A and the protrusions 114C. Moreover, the sum of the heights of the interposers 112B, the base 206C, and the interposers 112C is such that a gap wider than the height of the memory chips 110B is produced between the protrusions 114B of the base 206B and the protrusions 114D of the base 206D.

Thus, in the semiconductor device 202 of the second exemplary embodiment, the rectangular bases 206A, 206B, 206C, 206D are disposed in this sequence such that their orientations alternate by 90° in plan view. A structure can thereby be achieved in which the second chip is not in contact with the second base (for example, the memory chip 110A is not in contact with the base 206B). The bases 206A, 206B, 206C, 206D are similarly shaped members and commonality (general applicability) of the bases 206A, 206B, 206C, 206D can be achieved just by changing their orientations.

However, since no circuit boards are present further toward the upper side than the base 206D, for example, the length direction of the base 206D may be shortened, and the memory chips 110D may be disposed closer to the processor chip 108D.

In the second exemplary embodiment, the relationship between the bases 206A, 206B is that the base 206B is narrower in width than the base 206A in a case in which the length along the left-right direction of each circuit board viewed in the arrow D1 direction illustrated in FIG. 5 and FIG. 6 is defined as the "width". The relationship between the bases 206B, 206C is that the base 206C is narrower in width than the base 206B in a case in which the length along the left-right direction of each circuit board viewed in the arrow R1 direction is defined as the "width".

Next, explanation follows regarding a third exemplary embodiment. Elements, members, and the like in the third exemplary embodiment that are similar to those of the first exemplary embodiment are allocated the same reference numerals, and detailed explanation thereof is omitted.

Figure 7:
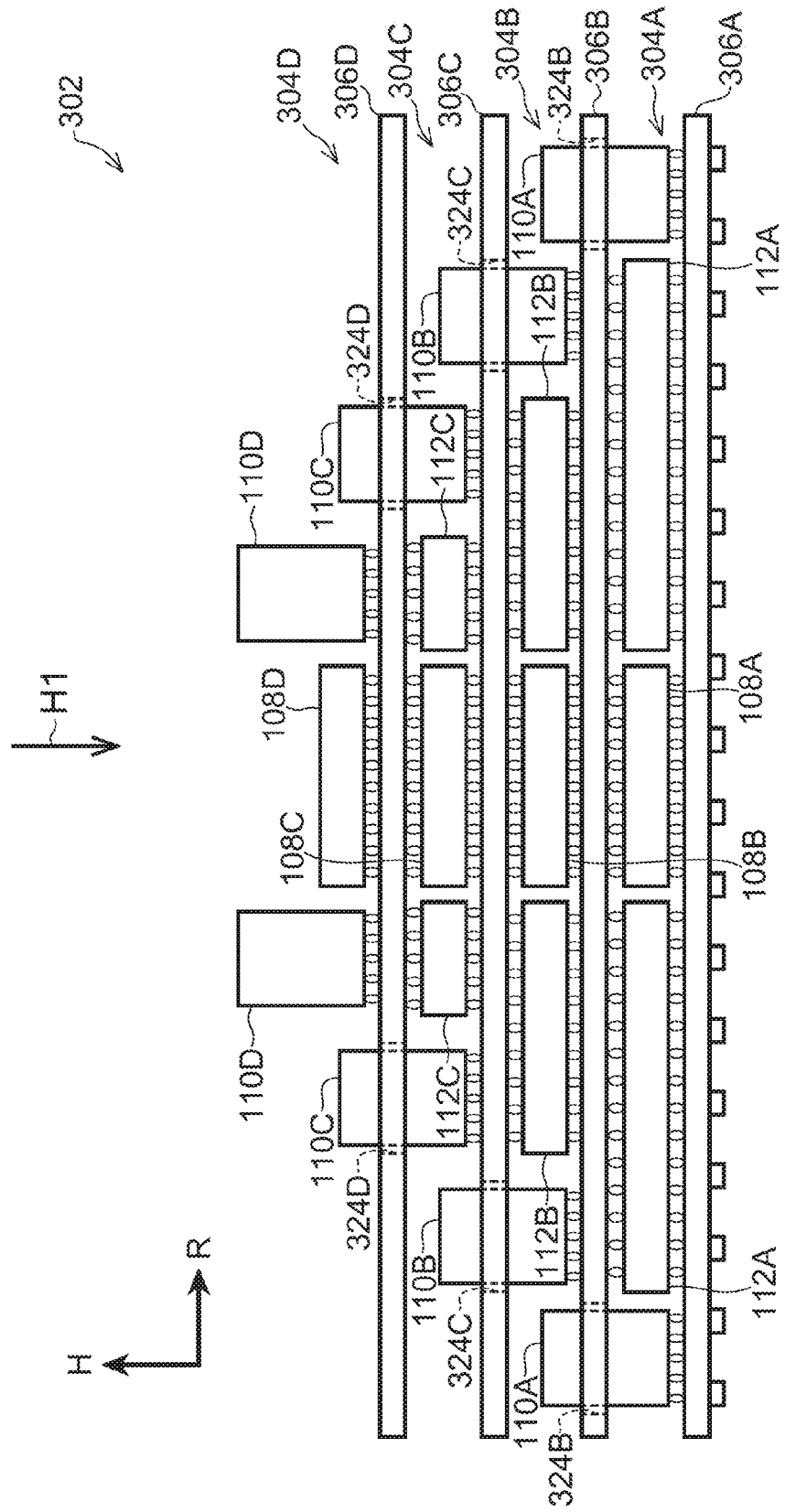
FIG. 7 is a face-on view illustrating a semiconductor device of a third exemplary embodiment.
Figure 8:
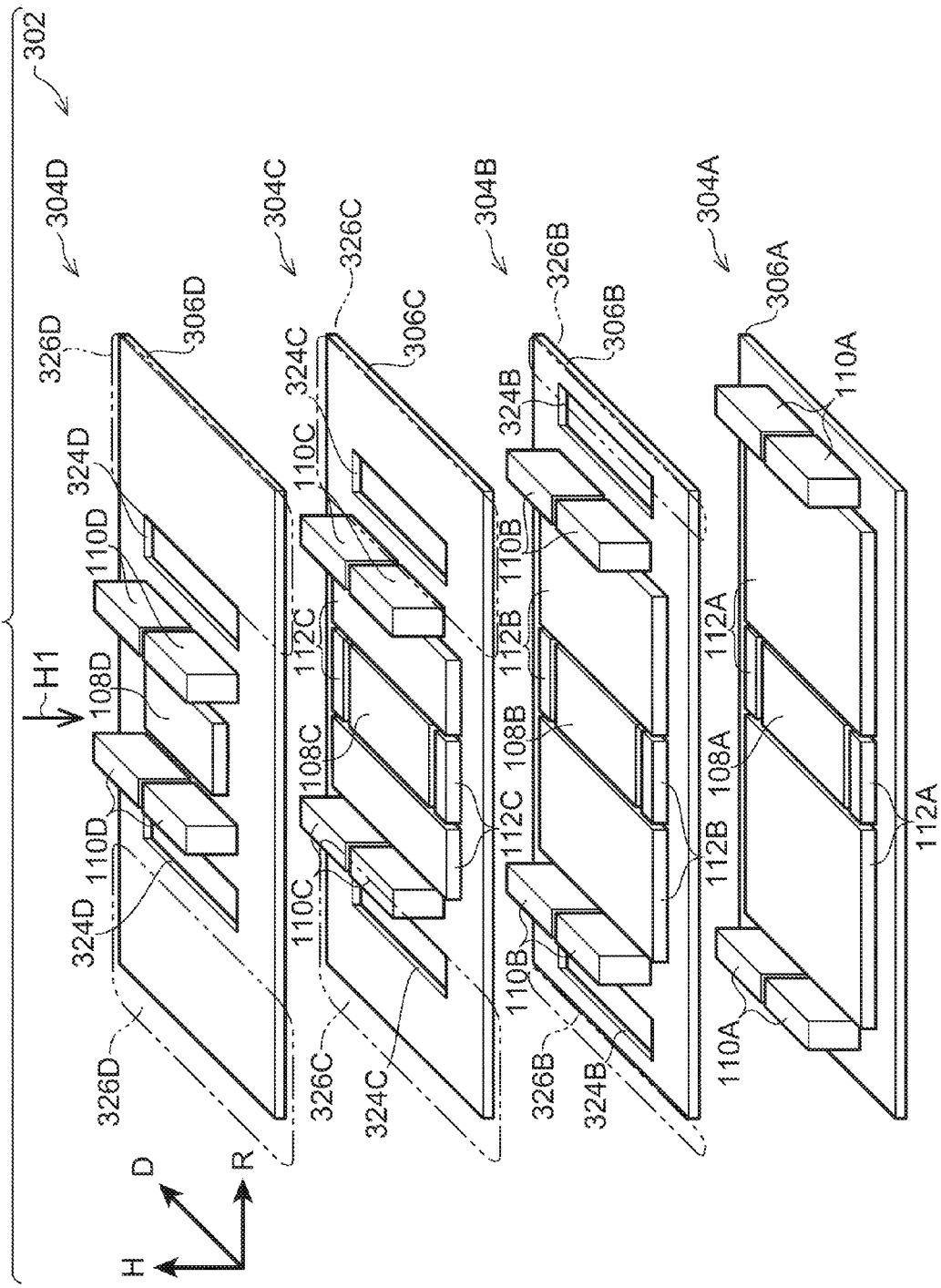
FIG. 8 is an exploded perspective view illustrating a semiconductor device of the third exemplary embodiment.
Figure 9:
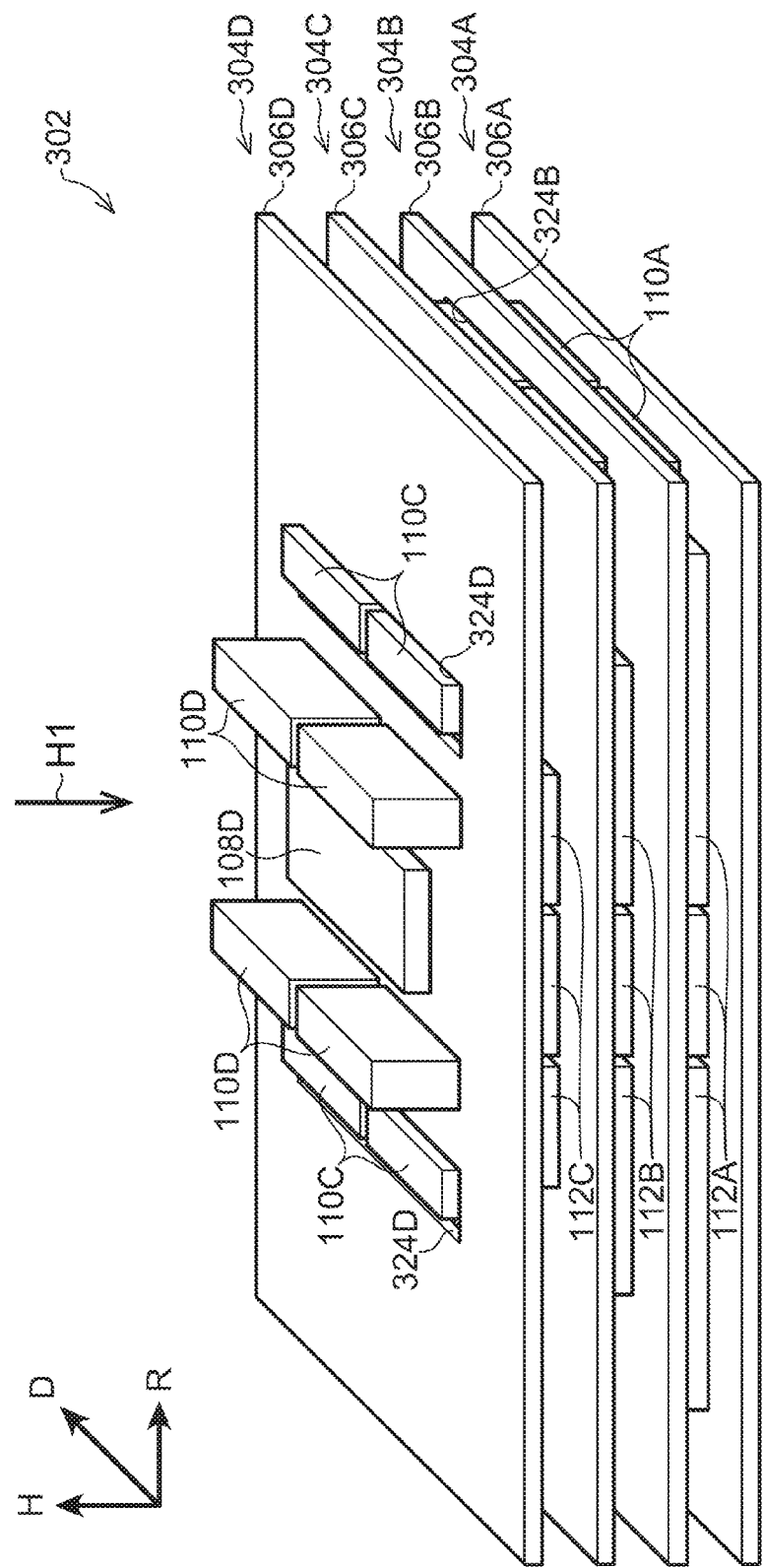
FIG. 9 is a perspective view illustrating a semiconductor device of the third exemplary embodiment.

As illustrated in FIG. 7 to FIG. 9, a semiconductor device 302 of a third exemplary embodiment includes plural (four in the example of FIG. 7 to FIG. 9) circuit boards 304A, 304B, 304C, 304D disposed overlapping with each other in this sequence. The circuit boards 304A, 304B, 304C, 304D each include a base 306A, 306B, 306C, 306D formed as a rectangular plate.

The processor chip 108A is disposed at the left-right direction center of the base 306A, and one, or plural, of the memory chips 110A are disposed in the vicinity of both left-right direction ends of the base 306A. Plural interposers 112A are disposed on the base 306A surrounding the processor chip 108A in plan view.

The processor chip 108B is disposed at the left-right direction center of the base 306B. Housing holes 324B are formed in the base 306B at positions corresponding to the memory chips 110A, in a state in which the circuit boards 304A, 304B are disposed overlapping with each other.

One, or plural, of the memory chips 110B are disposed near to, and at the inside of, the housing holes 324B, in the left-right direction of the base 306B. Plural interposers 112B are disposed on the base 306B surrounding the processor chip 108B in plan view.

The processor chip 108C is disposed at the left-right direction center of the base 306C. Housing holes 324C are formed in the base 306C at positions corresponding to the memory chips 110B, in a state in which the circuit boards 304B, 304C are disposed overlapping with each other.

One, or plural, of the memory chips 110C are disposed near to, and at the inside of, the housing holes 324C, in the left-right direction of the base 306C. Plural interposers 112C are disposed on the base 306C surrounding the processor chip 108C in plan view.

The processor chip 108D is disposed at the left-right direction center of the base 306D. Housing holes 324D are formed in the base 306D at positions corresponding to the memory chips 110C, in a state in which the circuit boards 304C, 304D are disposed overlapping with each other.

One, or plural, of the memory chips 110D are disposed near to, and at the inside of, the housing holes 324D in the left-right direction of the base 306D.

In the semiconductor device 302 of the third exemplary embodiment, the memory chips 110A are housed in the housing holes 324B that are formed in the base 306B in a state in which the circuit boards 304A, 304B are overlapping with each other, thus enabling the processor chips 108A, 108B to be stacked. Similarly, the memory chips 110B are housed in the housing holes 324C that are formed in the base 306C in a state in which the circuit boards 304B, 304C are overlapping with each other, thus enabling the processor chips 108B, 108C to be stacked. Moreover, the memory chips 110C are housed in the housing holes 324D that are formed in the base 306D in a state in which the circuit boards 304C, 304D are overlapping with each other, thus enabling the processor chips 108C, 108D to be stacked.

The semiconductor device 302 of the third exemplary embodiment has a structure in which memory chips are housed in housing holes formed in bases, and there are therefore few constraints on the size (the length direction width in particular) of each of the bases. For example, the bases 306A to 306D may all have the same width.

The semiconductor device 302 of the third exemplary embodiment can be described as having a structure in which the bases 306B, 306C, 306D include extensions 326B, 326C, 326D extending further toward the left-right direction outside than the housing holes 324B, 324C, 324D. The extensions 326B, 326C, 326D can be employed as mounting spaces for electrical components.

Next, explanation follows regarding a fourth exemplary embodiment. Elements, members, and the like in the fourth exemplary embodiment that are similar to those of the first exemplary embodiment are allocated the same reference numerals, and detailed explanation thereof is omitted.

Figure 10:
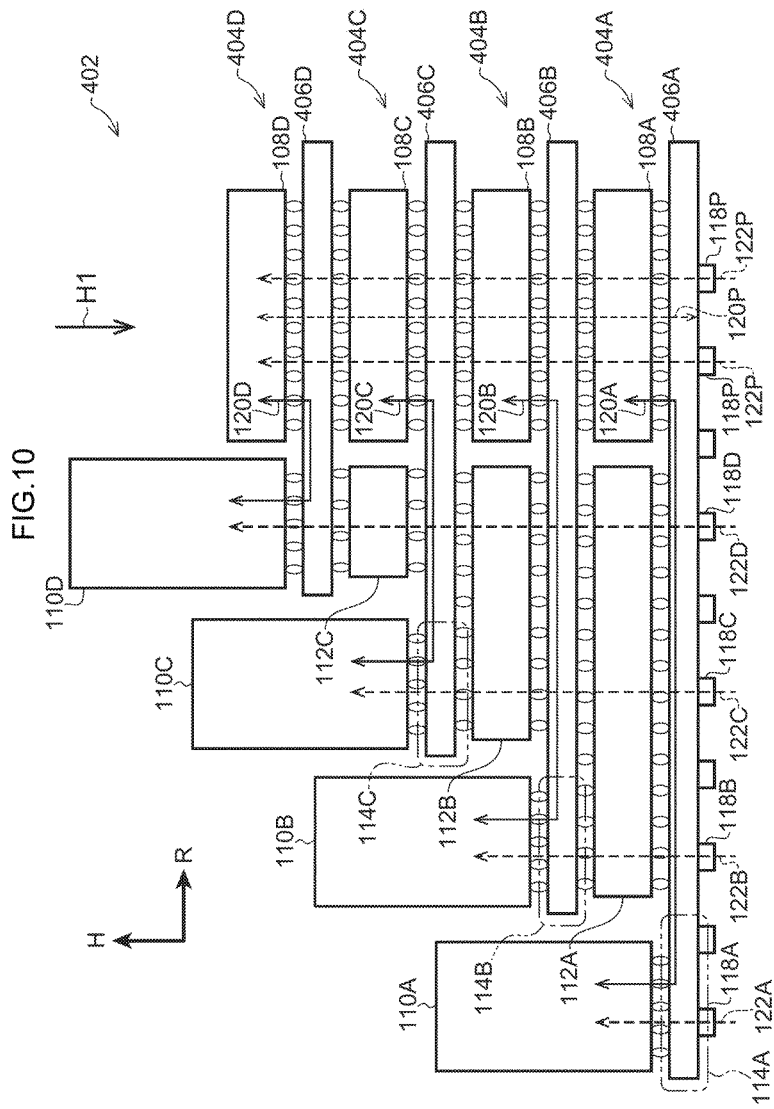
FIG. 10 is a face-on view illustrating a semiconductor device of a fourth exemplary embodiment.
Figure 11:
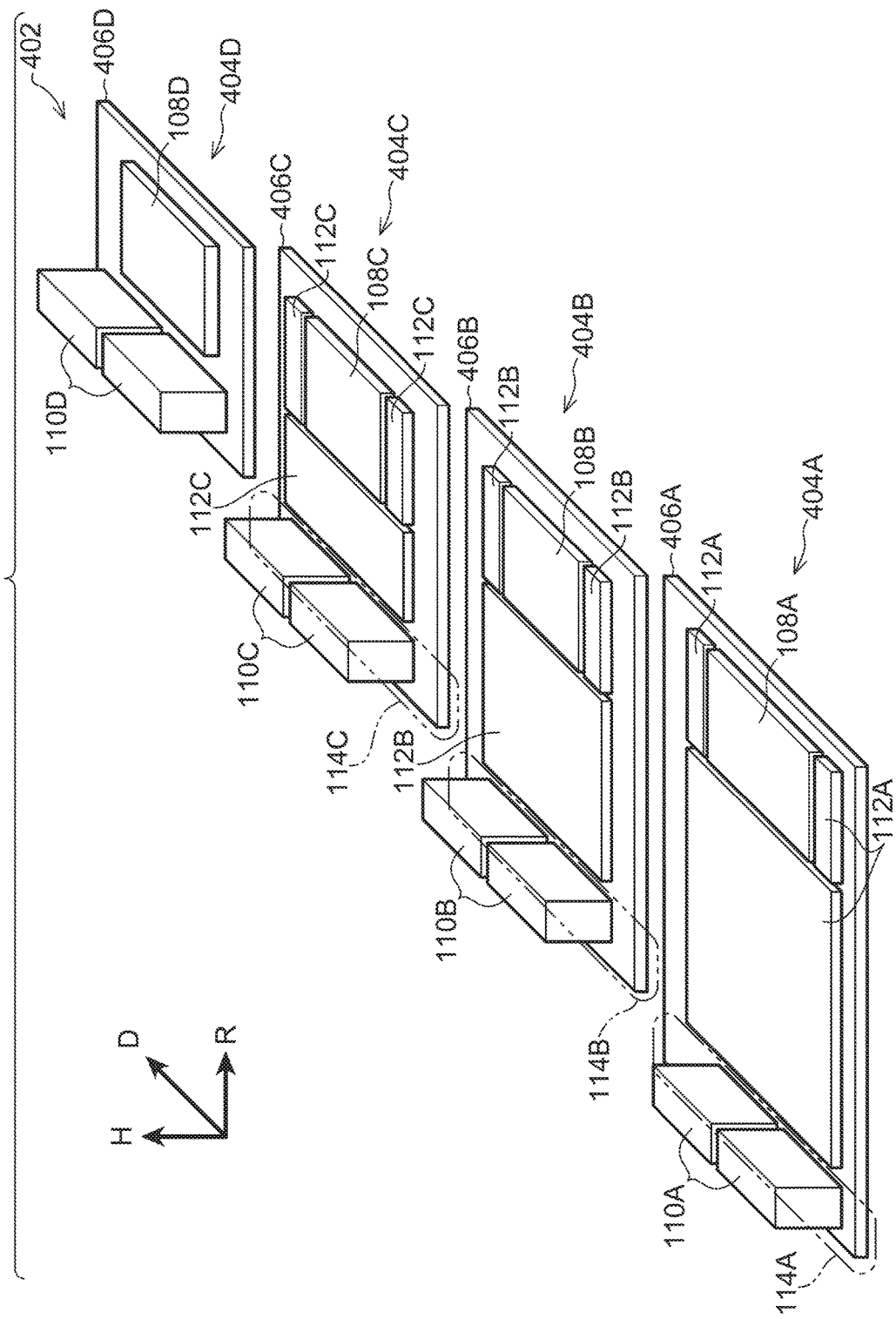
FIG. 11 is an exploded perspective view illustrating a semiconductor device of the fourth exemplary embodiment.
Figure 12:
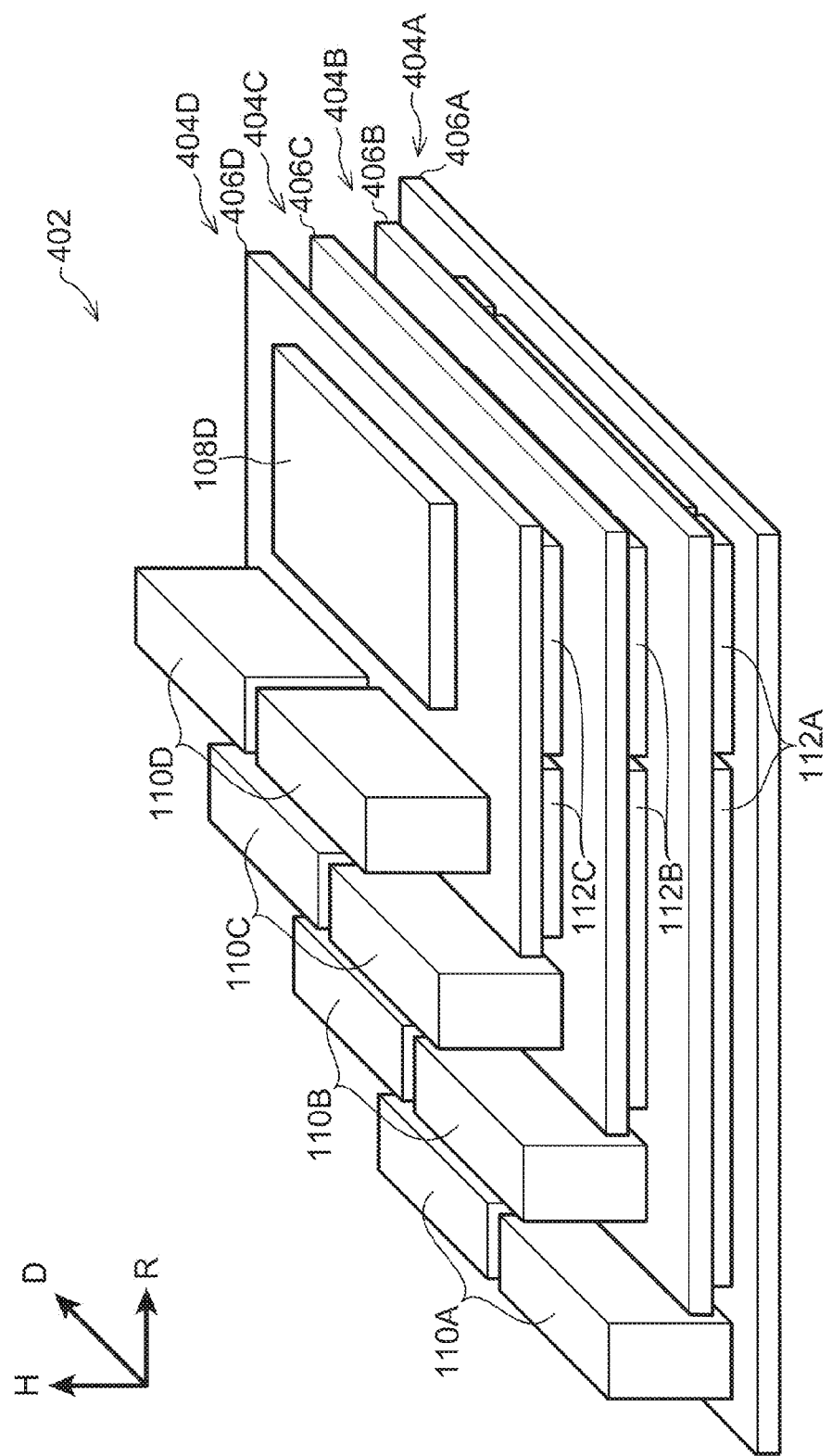
FIG. 12 is a perspective view illustrating a semiconductor device of the fourth exemplary embodiment.

As illustrated in FIG. 10 to FIG. 12, a semiconductor device 402 of a fourth exemplary embodiment includes plural (four in the example of FIG. 10 to FIG. 12) circuit boards 404A, 404B, 404C, 404D disposed overlapping with each other in this sequence. The circuit boards 404A, 404B, 404C, 404D each include a base 406A, 406B, 406C, 406D formed as a rectangular plate.

The processor chip 108A is disposed in the vicinity of one left-right direction end of the base 406A, and one, or plural, of the memory chips 110A are disposed in the vicinity of another left-right direction end of the base 406A. Plural interposers 112A are disposed on the base 406A surrounding the processor chip 108A in plan view.

The processor chip 108B is disposed in the vicinity of one left-right direction end of the base 406B, and one, or plural, of the memory chips 110B are disposed in the vicinity of another left-right direction end of the base 406B. Plural interposers 112B are disposed on the base 406B surrounding the processor chip 108B in plan view.

The processor chip 108C is disposed in the vicinity of one left-right direction end of the base 406C, and one, or plural, of the memory chips 110C are disposed in the vicinity of another left-right direction end of the base 406C. Plural interposers 112C are disposed on the base 406C surrounding the processor chip 108C in plan view.

The processor chip 108D is disposed in the vicinity of one left-right direction end of the base 406D, and one, or plural, of the memory chips 110D are disposed in the vicinity of another left-right direction end of the base 406D.

As illustrated in FIG. 10, in the semiconductor device 402 of the fourth exemplary embodiment, the circuit boards 404A, 404B, 404C, 404D narrow in width in this sequence, and have one end side aligned at the same position in the left-right direction. Accordingly, the protrusion 114A, which protrudes further toward the outside than the circuit board 404B, is formed at the other end side of the circuit board 404A. The memory chips 110A are mounted to the protrusion 114A.

Similarly, the protrusion 114B, which protrudes further toward the outside than the circuit board 404C, is formed at the other end side of the circuit board 404B. The memory chips 110B are mounted to the protrusion 114B.

Moreover, the protrusion 114C, which protrudes further toward the outside than the circuit board 404D, is formed at the other end side of the circuit board 404C. The memory chips 110C are mounted to the protrusion 114C.

In the semiconductor device 402 of the fourth exemplary embodiment, a base positioned at the upper side of each processor chip is narrower in width than a base positioned at the lower side of the processor chip, and has a shape that does not contact the memory chips mounted on a base at the lower side of the processor chip. In a structure in which plural circuit boards overlap with each other, processor chips can be stacked without restricting the height of the memory chips.

In the above explanation, processor chips are given as an example of a first chip and a third chip, and memory chips are given as an example of a second chip and a fourth chip. Examples of first chips, second chips, third chips, and fourth chips are not limited thereto. Other than the ASIC described above, examples of first chips and third chips include control chips such as microcontrollers.

Although an interposer was given as an example of a connecting member in the above explanation, the connecting member is not limited to an interposer as long as the connecting member can electrically connect the first base to the second base. For example, the first base may be electrically connected to the second base by a column shaped member formed from an electrically conductive material (such as a copper pillar).

The semiconductor devices of each of the exemplary embodiments above can be employed in, for example, a portable electrical device (such as a digital camera, a cellular phone, or a mobile computer). The semiconductor devices of each of the exemplary embodiments above are implemented in three dimensions by plural circuit boards, and enable miniaturization and increased density to be achieved in the semiconductor device. Employing the semiconductor devices of each of the exemplary embodiments above in the portable electronic device mentioned above can contribute to miniaturization, heightened performance, and increased functionality of the electronic device.

Although explanation regarding exemplary embodiments of technology disclosed herein has been given above, technology disclosed herein is not limited thereto, and obviously various modifications other than those described above may be implemented within a range not departing from the spirit of the present invention.

In technology disclosed herein, in a structure in which plural circuit boards having low height chips and high height chips mounted thereon overlap with each other, the low height chips can be stacked, and a wiring length between the low height chips and the high height chips on the circuit boards can be shortened.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. A semiconductor device comprising:
    a first circuit board having a first chip and a second chip mounted on a first base, with the second chip having a greater height from the first base than that of the first chip;
    a second circuit board having a third chip and a fourth chip mounted on a second base, the fourth chip having a greater height from the second base than that of the third chip, with the second circuit board disposed overlapping with the first circuit board such that the second base faces the first chip, and the second base not contacting the second chip; and
    an interposer that is disposed between the first base and the second base, and that electrically connects the first base and the second base,
    the height of the interposer from the first base is substantially the same as the height of the first chip from the first base.

2. The semiconductor device of claim 1, wherein a first power supply route from the first base to the second chip, and a second power supply route from the first base to the fourth chip are in different positions from each other in plan view of the first base.

3. The semiconductor device of claim 1, wherein:
    the second chip is housed in a housing hole that penetrates the second base such that the second base does not contact the second chip.

4. The semiconductor device of claim 1, wherein power is supplied to the third chip on the second base via the first base, the interposer, and the second base.

5. The semiconductor device of claim 1, wherein the interposer is electrically connected, via bumps, to the first base and the second base.

6. The semiconductor device of claim 1, wherein the interposer is disposed at a position surrounding the first chip in plan view of the first base.

7. The semiconductor device of claim 1, wherein the first chip is electrically connected, via bumps, to the first base and the second base.

8. The semiconductor device of claim 1, wherein the interposer is mounted on the first base.

9. The semiconductor device of claim 1, wherein the second base is narrower in width than the first base and does not contact the second chip.

10. The semiconductor device of claim 9, wherein:
    the first base further includes a protrusion protruding further toward an outer-side than the second base in plan view; and
    the second chip is mounted on the protrusion.

* * * * *